United States Patent [19]

Nagasubramanian et al.

[11] Patent Number: 5,272,359

[45] Date of Patent: Dec. 21, 1993

[54] REVERSIBLE NON-VOLATILE SWITCH BASED ON A TCNQ CHARGE TRANSFER COMPLEX

[75] Inventors: Ganesan Nagasubramanian, LaCrescenta; Salvador DiStefano, Alhambra; Jovan Moacanin, Los Angeles, all of Calif.

[73] Assignee: California Institute of Technology, Pasadena, Calif.

[21] Appl. No.: 631,230

[22] Filed: Dec. 21, 1990

Related U.S. Application Data

[63] Continuation of Ser. No. 178,482, Apr. 7, 1988, abandoned.

[51] Int. Cl.$^5$ ............................................. H01L 29/28
[52] U.S. Cl. ............................................. 257/40; 257/2
[58] Field of Search ................................. 357/8, 8.15

[56] References Cited

U.S. PATENT DOCUMENTS

| | | | |
|---|---|---|---|
| 3,341,362 | 9/1967 | Hacskaylo | 357/15 X |
| 3,519,999 | 7/1970 | Gregor | 357/15 X |
| 4,507,672 | 3/1985 | Potember et al. | 357/8 X |
| 4,761,677 | 8/1988 | Sasaki | 357/8 |
| 4,806,995 | 2/1989 | Day et al. | 357/8 |

FOREIGN PATENT DOCUMENTS 62-222669 9/1987 Japan ........................................ 357/8

OTHER PUBLICATIONS

Day et al, "Synthesis of Aliphatic Polymers..." Jour. of Polymer Science, Part A, vol. 24, 1986, pp. 645-654.
Reynolds, "Advances in the Chemistry of Conducting Organic Polymers," Jour. of Molecular Electronics, vol. 2, 1986, pp. 1-21.

*Primary Examiner*—Sara W. Crane
*Attorney, Agent, or Firm*—Benman & Collins

[57] ABSTRACT

A solid-state synaptic memory matrix (10) having switchable weakly conductive connections at each node (24) whose resistances can be selectably increased or decreased over several orders of magnitude by control signals of opposite polarity, and which will remain stable after the signals are removed, comprises an insulated substrate (16), a set of electrical conductors (14) upon which is deposited a layer (18) of an organic conducting polymer, which changes from an insulator to a conductor upon the transfer of electrons, such as polymerized pyrrole doped with 7,7,8,8-tetracyanoquinodimethane (TCNQ), covered by a second set of conductors (20) laid at right angles to the first.

4 Claims, 1 Drawing Sheet

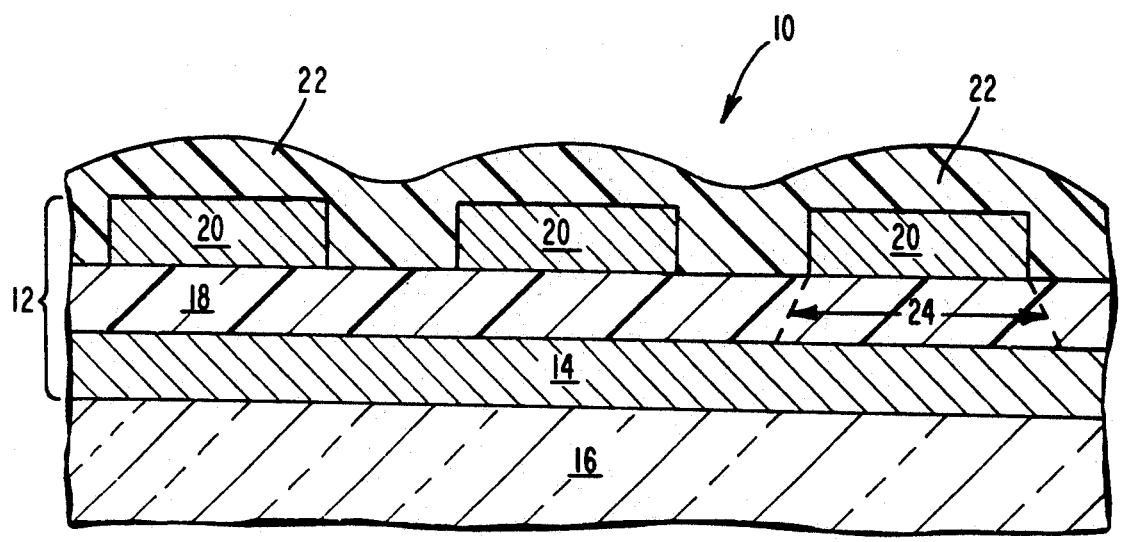

REVERSIBLE NON-VOLATILE SWITCH BASED ON A TCNQ CHARGE TRANSFER COMPLEX

ORIGIN OF INVENTION

The invention described herein was made in the performance of work under a NASA contract, and is subject to the provisions of Public Law 96-517 (35 USC 202) in which the Contractor has elected to retain title.

This is a continuation of co-pending application Ser. No. 07/178,482 filed on Apr. 7, 1988, abandoned.

TECHNICAL FIELD

The present invention relates broadly to electronic memories based on neural networks, and, more particularly, to reversible switches employing organic conducting polymers.

BACKGROUND ART

Neural network models offer a totally new approach to intelligent information processing that is robust, fault tolerant, and can be extremely fast. Such neural networks are discussed, for example, in A. P. Thakoor et al, "Binary Synaptic Connections Based on Memory Switching in a-Si:H", *Neural Networks for Computing*, J. S. Denker, Ed., American Institute of Physics Conference Proceedings #151, Snowbird, Utah, pp. 426-431 (1986).

The aforementioned features originate directly from the massive interconnectivity of neurons (the decision-making elements) in the brain and its ability to store information in a distributed manner as a large number of synaptic interconnects of varying strengths. Hardware implementations of neural network concepts, therefore, are attracting considerable attention. Such artificial neural networks are expected, for example, to function as high speed, content addressable, associative memories in large knowledge bases for artificial intelligence applications and robotics or to perform complex computational tasks such as combinatorial optimization for autonomous systems.

In particular, electronic implementation of an associative memory based on neural network models requires large arrays of extremely simple, binary connection elements or synaptic interconnects. Information is essentially stored in the binary states of the interconnects. Non-volatile storage of information therefore can take place at the time of fabrication of the synaptic array by making the resistive state of the desired interconnect "ON" or "OFF". Alternatively, significantly more useful memory systems can be built if programmable, binary resistive thin film devices (non-volatile microswitches) are used as synaptic interconnects.

Non-volatile, associative electronic memories based upon neural network models, with dense synaptic interconnection arrays in thin-film form, have recently been developed using hydrogenated amorphous silicon (a-Si:H). Similarly, using conventional photolithography, manganese dioxide based synapses have also been fabricated. Irreversible memory switching in hydrogenated amorphous silicon (OFF—>ON) and manganese dioxide (ON—>OFF) makes them ideally suited only for use as programmable, binary, weak synaptic connections in associative programmable read-only memories (PROMS) based on neural networks models. For many applications in computing and memory operations, it is also desirable to obtain the equivalents of erasable PROMs (EPROMs), such that the switching state can be reversed when desired (ON—>OFF—>ON etc.). A further desireable feature would allow control over the non-volatile resistance value so as to be able to predetermine a desired ON-state resistance value. Application Ser. No. 07/133,897, filed Dec. 16, 1987, and assigned to the same assignee as the present application discloses an EPROM having these characteristics, adapted especially for use in synaptic memory matrices. That system employs a resistive switching element that acts by transfer of ions from one layer to another. In some cases, it would be desirable to perform such switching in a faster manner than is possible with ion transfer, and to employ a switch with fewer layers—thus simpler and therefore cheaper to fabricate.

DISCLOSURE OF INVENTION

In accordance with the invention, a controllable, reversible, variable non-volatile resistance switching element is provided. The switching element is based on a doped organic conducting polymer material which controllably changes from an insulator to a conductor upon the transfer of electrons under the impetus of a control signal, and which can be reversed to the insulating state by another signal.

In particular, a solid-state synaptic memory matrix having switchable weakly conductive connections at each node whose resistances can be selectably increased or decreased over several orders of magnitude by control signals of opposite polarity, and which will remain stable after the signals are removed, comprises an insulated substrate, a set of electrical conductors upon which is deposited a layer of an organic conducting polymer, which changes from an insulator to a conductor upon the transfer of electrons, such as polymerized pyrrole doped with 7,7,8,8-tetracyanoquinodimethane (TCNQ), covered by a second set of conductors laid at right angles to the first.

BRIEF DESCRIPTION OF THE DRAWING

The sole FIGURE is a cross-sectional view, depicting one configuration employing the reversible, non-volatile switch of the invention.

BEST MODES FOR CARRYING OUT THE INVENTION

In recent years, organic conducting polymers (OCP) have generated widespread interest, having been proposed as materials of choice for a variety of applications including use as surface passivants, corrosion protection coatings on silicon in photoelectrochemical cells, electrochromic displays, batteries, and electrochemical sensors. The potential of these OCP materials to cycle between conducting and insulating forms makes them attractive for reversible switching applications, since this reversible nature is not inherent in inorganic switching materials such as amorphous silicon hydride. In spite of this salient feature, the emergence of the conducting organic polymers as possible candidate materials for switching applications has been deterred by the presence of liquid electrolytes (which act as source and sink for the counter ions). This usually involves bulky cell arrangements for containment.

In accordance with the invention, a solid state OCP switching material without any liquid electrolyte is provided which lends itself to the fabrication of high-density, thin film devices—particularly to an erasable read-only-memory (EPROM) especially suitable for use in a thin-film synaptic memory matrix, in which the change of state is accomplished by electron charge transfer. This material is polypyrrole doped by TCNQ, a solid compound which may be readily incorporated into solid state devices. The sole FIGURE illustrates a simplified cross-sectional schematic of a synaptic memory matrix 10 using this material as the resistive reversible switching element 12 at every node.

Referring to the FIGURE, a first set of parallel conductors 14 is laid down on a substrate 16 by electrodeposition, or any other process known to the art. These conductors are preferably fabricated from passive metals such as gold, platinum, or other conductive materials such as glassy carbon. As shown in the FIGURE, these conductors may form the matrix row conductors; alternatively, they may actually be the column conductors. Upon these is deposited a layer 18 of polypyrrole doped with TCNQ; this is the resistive switching layer. Next, a second set of parallel conductors 20 are deposited on top of the switching layer; its conductors running at right angles to the first set of conductors. Lastly, an insulating and sealing layer 22 is laid down on top of the second set of conductors. The switching areas 24 defined by the offset intersections of the row and column conductors form the synapse nodes wherein data is to be stored.

The substrate 16 may comprise any of the commonly known substrate materials, particularly insulating materials, such as ceramics, including silicon oxide, alumina, magnesia, and the like, polymers, etc. On the other hand, future generation devices may be formed on semiconductor substrates for direct interaction therewith. In any event, the composition of the substrate does not form a part of this invention.

The insulating and sealing layer 22 may also comprise well-known insulating materials such as silicon oxide, silicon nitride, silicon oxynitride, and the like. As with the substrate 12, the composition of the insulating and sealing layer does not form a part of this invention.

The composition and dimensions of the electrodes 14, 20 is not particularly critical, other than that the composition be compatible with the other materials employed in the switch. Dimensions will be largely governed by the particular conductive material selected, its deposition rate and the ability to control spacing between neighboring conductors.

In order to fabricate the switching layer 18, the substrate containing the first set of conductors is placed in an electrochemical cell, containing a solvent such as acetonitrile into which monomeric pyrrole is dissolved. Since this solution is neutral, a supporting electrolyte is added to enable conduction of current. This electrolyte may be a salt, such as tetrabutylammoniumperchlorate (TBAP), for example. The concentration of the salt is that commonly used for electrochemical studies, typically about 0.1M. A positive voltage, with respect to a second plate, is applied, causing a current to pass through the conducting solution, which causes a film of polymerized pyrrole to be plated on the substrate and first set of conductors.

The electrolyte also acts to dope the polypyrrole negatively; thus a reversed polarity voltage is applied for sufficient time to reduce the polymer and remove this unwanted dopant. The electrochemical technique allows one to quantitatively remove all of the dopant regardless of the voltage (once a threshold voltage is achieved). At this point, a lithium salt of TCNQ may be added to a new batch of acetonitrile solvent, and a very low positive voltage is again applied, on the order of 100 millivolts. This causes negative doping of the polypyrrole by the TCNQ.

Alternatively to the last step, TCNQ may be dissolved in a bath of acetonitrile and the assembly dipped in for sufficient time to cause the desired degree of doping.

The TCNQ doping may range from about 5 to 30 mole % of the polypyrrole. Less than about 5 mole % TCNQ does not provide the desired effect, while greater than about 30 mole % cannot be incorporated in the polymer.

The thickness of the film is determined by the amount of current passed in the initial step. However, in general, the thickness of the film is about 1 $\mu$m.

Control of the ON state resistance is accomplished by controlling the doping density during TCNQ doping; the higher the concentration of TCNQ and the longer the soak time the greater the dopant density and the lower the ON state resistance. Since neutral polypyrrole forms complexes spontaneously with TCNQ, the energy involved in the transition from insulator to conductor—and back—is very small. This transition occurs due to the migration of electrons of TCNQ into the polypyrrole, and back, in response to external stimulus. In the synaptic memory matrix, this stimulus is a voltage applied across the desired row and column conductors, the design being tailored such that this voltage exceeds the normal operating voltage of the circuit. Ideally, for a five-volt operating voltage application, switching would be carried out by the imposition of a positive five volts to one conductor and a negative five volts to the other, such that the resulting ten volts causes electron charge transfer. To reverse states, the ten volts is reapplied, but with the opposite polarity, such that the original electron migration is reversed.

Briefly, the data may be written and erased as follows: The resistance between contacts is changed by applying the proper positive write voltage to a desired pair of row and column conductors, then the write voltage is removed. The area of the resistance between those conductors acts as the switching element in the synapse matrix; the ON state may be represented by a lower resistance while the OFF state may be represented by a higher resistance, for example. The presences of one state, typically the ON state, denotes a stored bit, which is non-volatile and will stay stored as long as desired. If the stored bit is to be removed, the negative polarity erase signal is applied to the same pair of conductors until the higher resistance OFF state is attained. As with an EPROM, an entire section of memory may be erased by connecting all conductors simultaneously to the erase voltage. Selected groups of nodes representing a word may be erased together once identified.

When reading the data, the presence of the lower resistance nodes is detected. This may be done on a location-addressed basis, line-byline or by associative recall prompting.

Preliminary tests reveal a change in resistance from the insulating OFF state to the weakly conducting ON state of about five orders of magnitude: from about $10^{12}$ ohms to about $10^7$ ohms. The 10 megohm resistance in the ON state is highly desirable, to allow for a high density of nodes while avoiding thermal dissipation problems. Previous thin-film synapse memories have attained a packing density of $10^9$ bits per $cm^2$.

In contradistinction to the the thin-film EPROM of Ser. No. 07/133,897, the ON state resistance cannot be varied during operation by application of a control voltage to a separate gate. However, since the charge transfer mechanism in the EPROM of the aforementioned application is the flow of ions, and that in the instant invention is due to the flow of electrons, this innovation has much faster write and erase times. Early tests have shown complete changes of state well within a 100 millisecond pulse. It is anticipated that the ultimate response time will be less than a few milliseconds. Since it is believed that there is actually some molecular rearrangement occurring during charge transfer, it is not felt that the ultimate switching times will be short enough to permit use of this invention as a read-only-memory, capable of reading and writing at high speed clock rates. However, its speed is such that it is fully compatible with current transistor EPROM capabilities.

Thus, there has been provided a solid state, reversible, non-volatile switch, adapted for use, for example, with neural networks. It will be clear to one skilled in the art that various changes and modifications may be made, and all such changes and modifications are considered to fall within the scope of the invention, as defined by the appended claims.

What is claimed is:

1. A resistive reversible, non-volatile memory switch exhibiting a change in resistivity from a tunable ON state to an OFF state comprising:
   (a) a first electrode supported on a substrate;
   (b) an organic conducting polymer formed on the surface of said first electrode, said polymer consisting essentially of polymerized pyrrole doped with about 5 to 30 mole % of 7,7,8,8-tetracyanoquinodimethane; and
   (c) a second electrode formed thereover and oriented orthogonal thereto, wherein said tunable ON state is determined by the amount of doping.

2. The memory switch of claim 1 further comprising an insulating and sealing layer coating any exposed portions of said first and second electrodes and said organic polymer.

3. The memory switch of claim 1 wherein said first and second electrodes comprise material selected from the group consisting of platinum, gold, and glassy carbon.

4. The memory switch of claim 1 wherein said organic conducting polymer is about 1 $\mu$m thick.

* * * * *